United States Patent
Maruno

(10) Patent No.: US 7,570,303 B2
(45) Date of Patent: Aug. 4, 2009

(54) IMAGE PICK-UP ELEMENT ASSEMBLY AND IMAGE PICK-UP ELEMENT

(75) Inventor: Hiromasa Maruno, Kyoto (JP)

(73) Assignee: Shimadzu Corporation, Kyoto-Shi (JP)

( * ) Notice: Subject to any disclaimer, the term of this patent is extended or adjusted under 35 U.S.C. 154(b) by 405 days.

(21) Appl. No.: 11/383,862

(22) Filed: May 17, 2006

(65) Prior Publication Data

US 2006/0268160 A1  Nov. 30, 2006

(30) Foreign Application Priority Data

May 24, 2005  (JP) .............................. 2005-150758

(51) Int. Cl.
*H04N 5/225* (2006.01)
*H01J 40/14* (2006.01)

(52) U.S. Cl. .................. 348/374; 250/238; 250/239

(58) Field of Classification Search ......... 348/373–376; 250/238, 239; 361/688
See application file for complete search history.

(56) References Cited

U.S. PATENT DOCUMENTS 5,508,740 A  4/1996  Miyaguchi et al.
6,307,590 B1 *  10/2001  Yoshida ...................... 348/340
6,960,759 B2 *  11/2005  Konagaya .................... 250/238
7,120,025 B2 *  10/2006  Hirano ......................... 361/704
2004/0169771 A1 *  9/2004  Washington et al. ......... 348/374

FOREIGN PATENT DOCUMENTS

JP  4-217350  8/1992
JP  7-336608  12/1995
JP  9-55889  2/1997

* cited by examiner

*Primary Examiner*—David L Ometz
*Assistant Examiner*—Dillon Durnford-Geszvain
(74) *Attorney, Agent, or Firm*—Rankin, Hill & Clark LLP

(57) ABSTRACT

An image pick-up element 1 is mounted on an element mounting part 7 formed with a member whose thermal conductivity is higher than that of an element storing part 3. Inputting and outputting pins 5 for electrically connecting the image pick-up element to a control circuit board 13 for controlling the image pick-up element are provided in a direction that does not interfere with the contact part of the element mounting part 7 and a heat absorbing mechanism 8. Thus, the thermal conductivity of the image pick-up element and the heat absorbing mechanism can be improved and the area of a heat absorbing part can be increased. As a result, the cooling capability of the element is increased so that the image pick-up element can be driven under a condition at higher speed than usual.

9 Claims, 3 Drawing Sheets

IMAGE PICK-UP ELEMENT ASSEMBLY AND IMAGE PICK-UP ELEMENT

TECHNICAL FIELD

The present disclosure relates to an image pick-up element assembly and an image pick-up element having pixels for generating a signal corresponding to the luminance of an incident light to shoot or photograph the image of an object to be shot. More particularly, the present disclosure relates to an image pick-up element assembly for a high speed shooting that is preferably suitable for shooting or photographing a phenomenon such as an explosion, a destruction, burning, or the like.

RELATED ART

Usually, as an element for picking up the image of an object to be shot, a CCD type or a CMOS type image pick-up element has been used. In recent years, a high-speed shooting device has been also developed that shoots or photographs a high speed phenomenon such as an explosion, a destruction, burning, a collision, a discharge or the like. Further, in order to achieve a shooting operation at an extremely high speed such as about 1,000,000 sheets/second that cannot be met by the usual ordinary CCD type or CMOS type image pick-up element, an image pick-up element having a special structure as described in, for instance, Japanese patent document No. 9-55889 (which is hereinafter referred as Patent Document 1) is likewise developed.

Such an image pick-up element is ordinarily mounted on a package to form an image pick-up element assembly, so that the image pick-up element is protected from a breakage by an external force and a contamination by dust or water. FIG. 3 is a sectional view of the image pick-up element assembly in which the image pick-up element is mounted on the package. An image pick-up element 14 is stuck to a bottom surface of an element storing part 16 formed with an insulator such as aluminum nitride (AlN). Further, a signal input for taking out a signal from the image pick-up element and operating the image pick-up element is carried out by connecting an electrode 15 formed in the image pick-up element to an electrode 17 formed on the bottom surface of the element storing part by a wire bonding method to electrically conduct the electrode 15 to the electrode 17 and connecting the image pick-up element to a control circuit board 21 through an inputting and outputting pin 18 formed so as to protrude on the back surface of the element storing part. Further, to the element storing part 16, a window material 19 for transmitting light is stuck to prevent the entry of dust from an external part.

When a shooting or photographing operation is performed by the high-speed shooting device on which the image pick-up element as described above is mounted, voltage is applied to the image pick-up element with a driving frequency corresponding to a shooting speed. Thus, the image pick-up element generates heat. Especially, in the case of the image pick-up element having the structure described in the Patent Document 1, since a heat generation rate increases in proportion to the applied voltage and the frequency of the applied voltage, when the high-speed shooting operation as high as about 1,000,000 sheets/second is carried out, the heat generation rate enormously increases. Accordingly, the image pick-up element is broken owing to an excessive rise of temperature.

To overcome this phenomenon, the image pick-up element is ordinarily cooled. The image pick-up element is cooled, as shown in FIG. 3, by providing a cooling device 20 on the back surface of the element storing part on which the element is mounted. The cooling device employs systems including an air cooled type in which a heat radiating plate is provided on the back surface of the element storing part to supply air to the heat radiating plate by a fan or the like, a water cooled type in which a heat exchanger is provided separately from the cooling part on the back surface of the element storing part to circulate water between the cooling part and the heat exchanger and an electronic type for absorbing heat by a Peltier effect.

In the usual package, since the element storing part on which the image pick-up element is mounted needs to be formed with an insulator such as alumina nitride to assure the electric insulation of the electrode 17 formed inside the element storing part. The thermal conductivity of the insulator is lower than that of an electric conductive material such as metal. Accordingly, the heat generated in the image pick-up element cannot be efficiently transmitted to the back surface of the element storing part. Further, since the inputting and outputting pin 18 for applying the driving voltage to the image pick-up element and taking out the signal from the image pick-up element protrudes on the back surface of the element storing part, when a cooling mechanism 20 is to be disposed without interfering with the inputting and outputting pin 18, an attaching area is restricted. As a result, a cooling capability is restricted so that the operating speed of the image pick-up element is limited.

SUMMARY

The disclosure below describes an image pick-up element assembly that can perform a high-speed shooting operation as high as 1,000,000 sheets/second or more by increasing the cooling capability of an image pick-up element, and an image pick-up element.

In one aspect, the disclosure describes image pick-up element assembly comprising: an element storing part for storing an image pick-up element therein; a window material provided in an opening formed on one surface of the element storing part so as to face a front surface of the image pick-up element; an element mounting part made of a material whose thermal conductivity is higher than that of the element storing part, for mounting the image pick-up element, the element mounting part provided in a back surface of the element storing part opposite to the window material in a state that it passes through the back surface of the element storing part; and an inputting and outputting pin provided in other surface than the surface of the element storing part through which the element mounting part passes, for electrically connecting the image pick-up element to an external circuit.

The element mounting part efficiently transmits the heat generated in the image pick-up element, and the inputting and outputting pin is provided at a position other than the direction of a back surface relative to a light receiving surface. Accordingly, when the cooling mechanism is mounted on the element mounting part, the inputting and outputting pin does not interfere with the cooling mechanism.

Various implementations may include one or more the following advantages. For example, the element mounting part is formed with a member whose thermal conductivity is higher than that of the element storing part. Further, the interference of the heat absorbing part of the element mounting part with the inputting and outputting pin is eliminated, so that the thermal conductivity of the image pick-up element and a heat absorbing mechanism can be improved and the area of the heat absorbing part can be increased. Thus, the cooling capability can be increased and the image pick-up element can be driven under a condition at higher speed than a usual technique.

Other features and advantages may be apparent from the following detailed description, the accompanying drawings and the claims.

DETAILED DESCRIPTION

Figure 1:
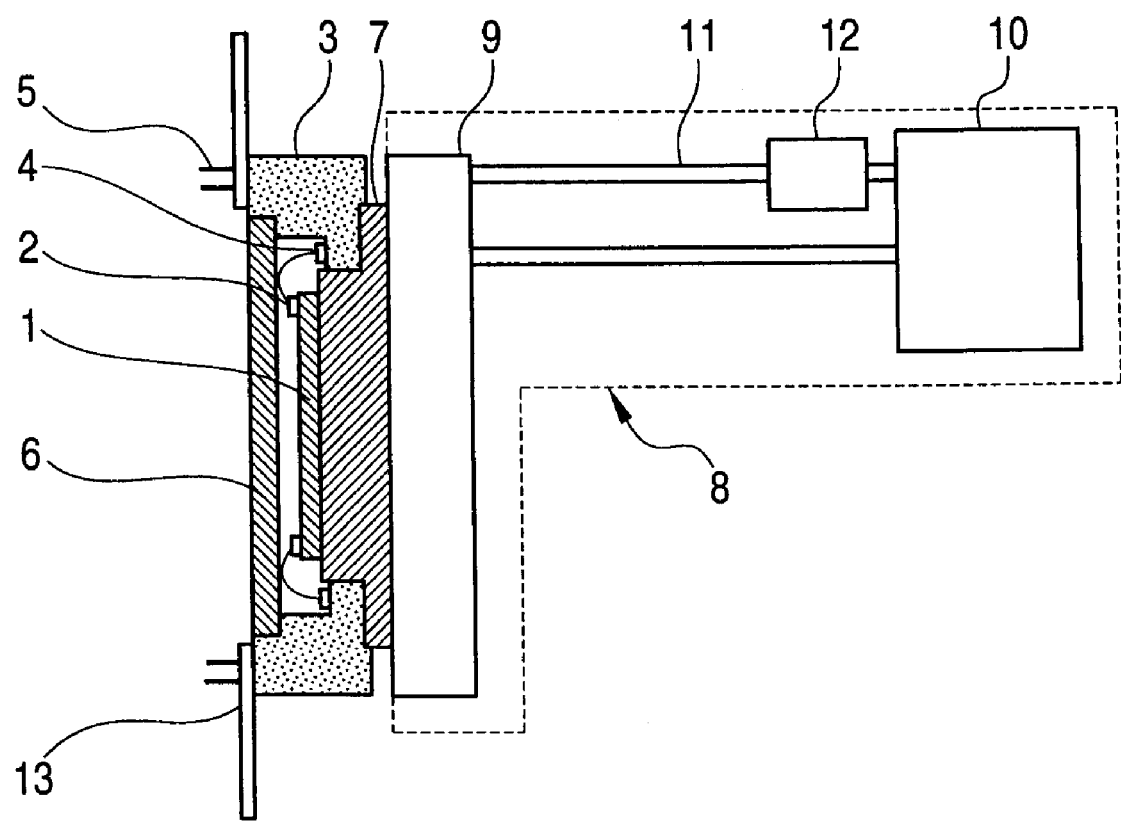
FIG. 1 is an explanatory view showing an image pick-up element assembly of the present invention (first embodiment).

FIG. 1 is a sectional view of one embodiment (first embodiment) of a device of the present invention. An image pick-up element 1 is manufactured by a deposition, sputtering, a thin film forming technique of a CVD or a thin film processing technique such as etching. The image pick-up element 1 includes a light receiving surface composed of a plurality of pixels having light receiving elements for generating signals corresponding to the luminance of an incident light, and a signal accumulating part that is provided in the pixels or in the vicinity thereof and accumulates the signals respectively generated by the light receiving elements during a shooting or photographing operation. Further, after the shooting operation is completed, the signals accumulated in the signal accumulating part are outputted.

An element mounting part 7 is made of a copper tungsten alloy and an element storing part 3 is made of aluminum nitride (AlN). These members are air-tightly bonded together to be formed integrally. The image pick-up element 1 is stuck to the element mounting part 7. The thermal conductivity of the copper tungsten alloy is 200 W/m·k and higher than the thermal conductivity (150 W/m·k) of the aluminum nitride (AlN). Accordingly heat generated in the element mounting part 7 can be efficiently discharged outside.

An electrode 2 for applying a driving voltage to operate the image pick-up element and taking out the signals accumulated in the image pick-up element is connected to an electrode 4 formed inside the element storing part by wire bonding. The electrode 4 is connected to a control circuit board 13 for controlling the image pick-up element 1 by inputting and outputting pins 5 provided in the light receiving surface side.

A cooling mechanism 8 comes into contact with the back surface of the element mounting part 7. The cooling mechanism 8 includes a heat absorbing part 9 for absorbing heat generated in the image pick-up element 1, a heat radiating part 10 for radiating the heat absorbed by the heat absorbing part 9 to atmospheric air, a piping 11 for connecting the heat absorbing part 9 to the heat radiating part 10, and a pump 12 for circulating cooling water in the piping. The cooling mechanism 8 may be replaced by a different cooling mechanism from that of this embodiment, for instance, other systems employed as the related art such as an air cooled type in which a heat radiating plate is provided on the back surface of the element storing part to supply air to the heat radiating plate by a fan or the like or an electronic type for absorbing heat by a Peltier effect.

A window material 6 made of transparent glass is stuck to a part opposed to the light receiving surface of the image pick-up element 1. Since the window material is stuck to the part opposed to the light receiving surface, the image pick-up element is prevented from being deteriorated owing to the adhesion of dirt or dust to the light receiving surface of the image pick-up element. Further, in this embodiment, the element storing part 3 is air-tightly stuck to the window material 6 under a dry nitrogen atmosphere. Thus, nitrogen is sealed in the element storing part to prevent the deterioration of the element due to the entry of water.

Figure 2:
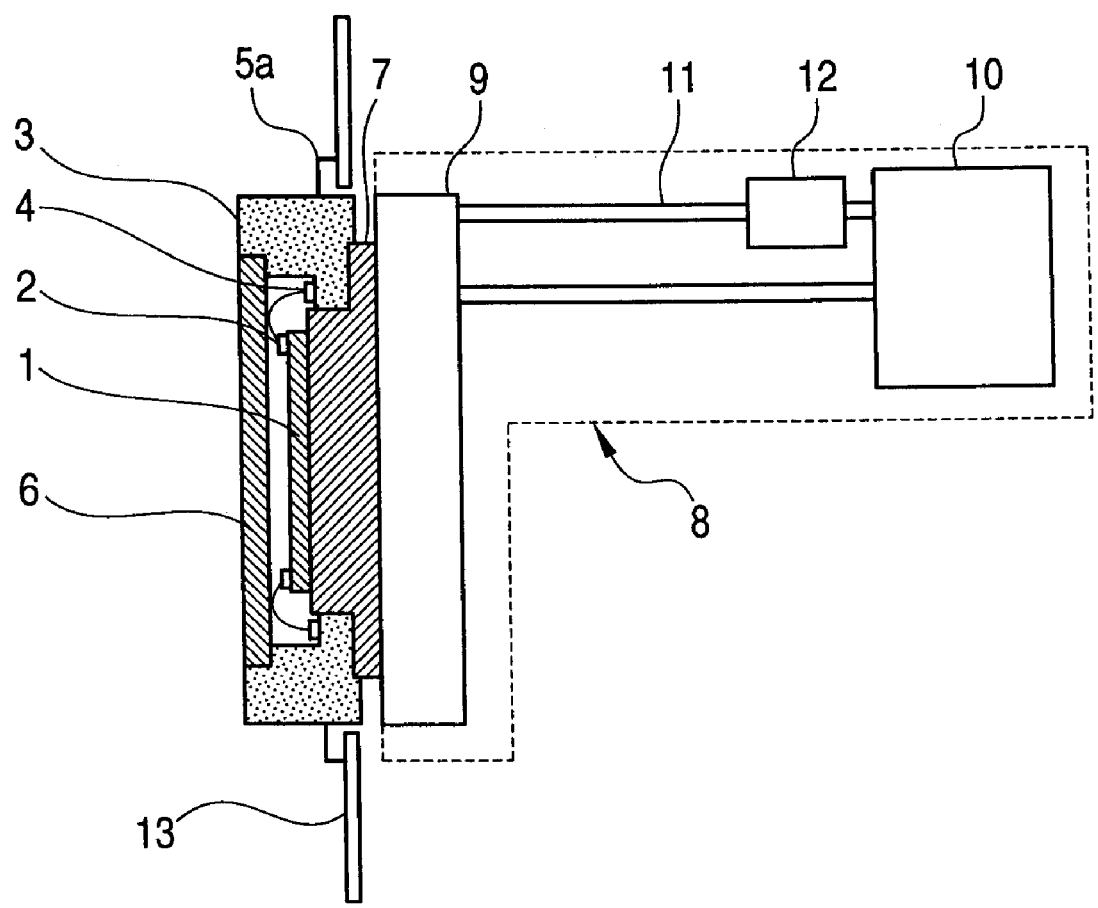
FIG. 2 is an explanatory view showing an image pick-up element assembly of the present invention (second embodiment).
Figure 3:
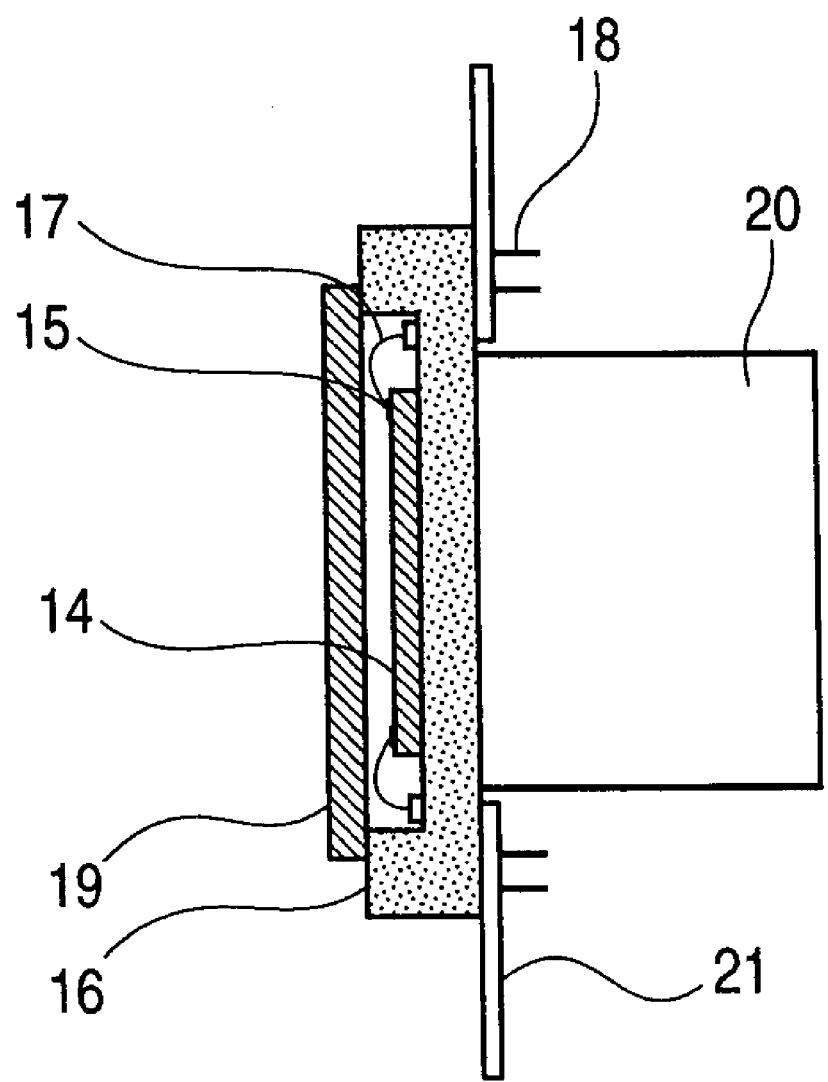
FIG. 3 is an explanatory view showing a usual image pick-up element assembly.

Another embodiment (second embodiment) of the present invention is shown in FIG. 2. In FIG. 2, the same components as those of FIG. 1 are designated by the same reference numerals and a detailed description thereof is omitted. In the second embodiment, inputting and outputting pins 5a are provided on side surfaces of an element storing part 3. The inputting and outputting pins 5a are provided on the side surfaces of the element storing part 3, so that a control circuit board 13 does not need to be attached to the front surface of a window material 6. Accordingly, an optical system such as a lens can be attached more closely to an image pick-up element assembly.

In the above-described embodiment, the image pick-up element having the signal accumulating part is mentioned. However, it is to be understood that even if other image pick-up element than the above-described image pick-up element is mounted on an element mounting part, this image pick-up element is included in claims of the present invention.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. An image pick-up element assembly comprising:
    an image pick-up element including a plurality of pixels that generate signals corresponding to the strength of an incident light;
    an element storing part for storing the image pick-up element, and having a first surface, a second surface opposite to the first surface, and a third surface intersecting the first surface and the second surface, the element storing part being made of a material having a thermal conductivity;
    a window material provided in a first opening formed in the first surface of the element storing part facing the pixels of the image pick-up element;
    an element mounting part made of a material having a second thermal conductivity which is higher than the first thermal conductivity, and being in contact with the second surface of the element storing part, the element mounting part having a first face on which the image pick-up element is mounted at an inside of the element storing part, and a second face exposed at the second surface of the element storing part and adapted to be brought into contact with a cooling mechanism; and
    an inputting and outputting pin arranged to be electrically connected to a circuit board for controlling the image pick-up element, and provided at an area other than an area that the second surface of the element storing part faces.

2. The image pick-up element assembly according to claim 1,
    wherein the element mounting part is made of a copper tungsten alloy plate.

3. The image pick-up element assembly according to claim 1,
   wherein the inputting and outputting pin is provided on the first surface of the element storing part.

4. The image pick-up element assembly according to claim 1,
   wherein the inputting and outputting pin is provided in the third surface of the element storing part.

5. The image pick-up element assembly according to claim 1,
   wherein a first electrode is provided on the image pick-up element and a second electrode is provided on an inside of the second surface of the element storing part so as to be surrounded by the element storing part,
   wherein the first and second electrodes are connected through wire bonding, and
   the second electrode is connected to the external circuit through the inputting and outputting pin.

6. The image pick-up element according to claim 5, wherein the external circuit is attached to the first surface of the element storing part.

7. The image pick-up element according to claim 5, wherein the external circuit is disposed adjacent to the third surface of the element storing part.

8. The image pick-up element according to claim 1, wherein the first opening of the element storing part has side edges having a ledge, wherein said ledge has a height that is substantially equivalent to the height of the window material, such that when said window material is mounted in the first opening, the first surface of the element storing part and a front surface of the window material are substantially flush with one another.

9. The image pick-up element according to claim 1, wherein the element mounting part includes a front portion and a rear portion integrally formed with the front portion,
   wherein a width of the front portion is less than a width of the second opening in the second surface of the element storing part and a width of the rear portion is greater than the width of the second opening, such that when the element storing part is mounted on the element mounting part, the front portion of the element mounting part passes through the second opening into the element storing part and the rear portion of the element mounting part remains outside of the enclosure.

* * * * *